United States Patent [19]
Salcone

[11] Patent Number: 4,910,416
[45] Date of Patent: Mar. 20, 1990

[54] POWER SWITCH MONITOR TO IMPROVE SWITCHING TIME

[75] Inventor: Michael D. Salcone, Verona, Pa.

[73] Assignee: Modicon, Inc., North Andover, Mass.

[21] Appl. No.: 164,209

[22] Filed: Mar. 4, 1988

[51] Int. Cl.$^4$ .................. H03K 17/60; H03K 17/28
[52] U.S. Cl. .................................... 307/254; 307/456;
307/591; 307/592; 307/270; 307/300; 330/251
[58] Field of Search ............... 307/254, 456, 300, 591,
307/592, 270; 330/251, 207 A

[56] References Cited

U.S. PATENT DOCUMENTS

| | | | |
|---|---|---|---|
| 3,526,846 | 9/1970 | Campbell | 330/207 A |
| 4,028,633 | 6/1977 | Rogers et al. | 330/207 A X |
| 4,125,814 | 11/1978 | Baker | 330/251 |
| 4,618,782 | 10/1986 | Lang et al. | 307/300 |
| 4,638,240 | 1/1987 | Pauker et al. | 307/300 X |
| 4,716,304 | 12/1987 | Fiebig et al. | 307/254 |
| 4,775,803 | 10/1988 | Mori | 307/254 |

OTHER PUBLICATIONS

F. Ainscow, "Saturating Video Driver", IBM, vol. 25, No. 2, Jul. 1982.

Primary Examiner—Stanley D. Miller
Assistant Examiner—Huy K. Mai
Attorney, Agent, or Firm—Mattern, Ware, Stoltz & Fressola

[57] ABSTRACT

The present invention provides an improved device for minimizing the time delays associated with turning on and off the power switches or power transistors in a standard totem pole configuration. An improved saturation detector monitors each transistor to determine when it is in saturation and generates a feedback signal which is combined with the input signal to generate the appropriate time delay needed to improve the switching time of the transistor.

6 Claims, 7 Drawing Sheets

FIG. 1

PRIOR ART

FIG. 2

PRIOR ART

FIG. 3

PRIOR ART

POWER SWITCH MONITOR TO IMPROVE SWITCHING TIME

FIELD OF THE INVENTION

The present invention relates to a device for minimizing the time delays associated with turning on and off the power switches used in a standard totem pole configuration.

BACKGROUND OF THE INVENTION

Figure 1:
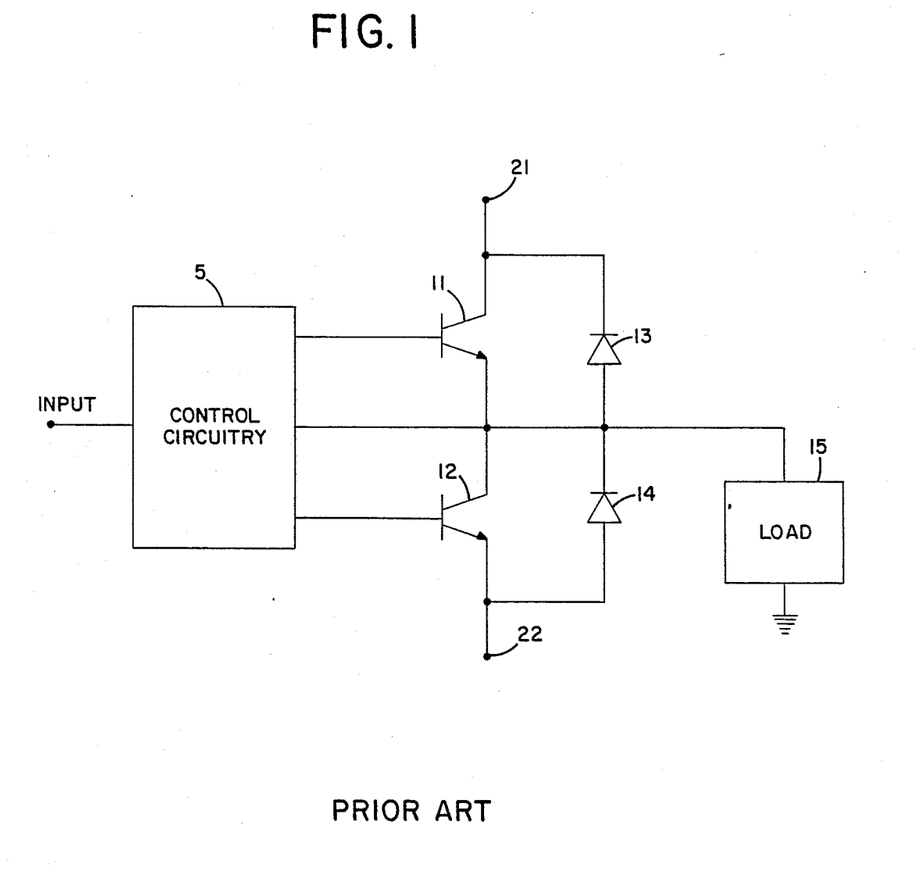
FIG. 1 is a prior art totem pole power amplifier.

FIG. 1 shows a standard prior art totem pole power amplifier. Two power switches or power transistors 11 and 12 are connected together between two power supplies or between two poles, V(+) and V(−), of a bipolar power supply, 21 and 22, respectively. Transistors 11 and 12 turn on and off in response to control circuitry 5 which modifies an input signal. Transistors 11 and 12 can be NPN, PNP, MOSFET, IGT, or any combination thereof. Transistor 11 supplies or sources current to load 15 whereas transistor 12 removes or sinks current from load 15. The totem pole configuration is used whenever a bipolar output current is required.

Figure 2:
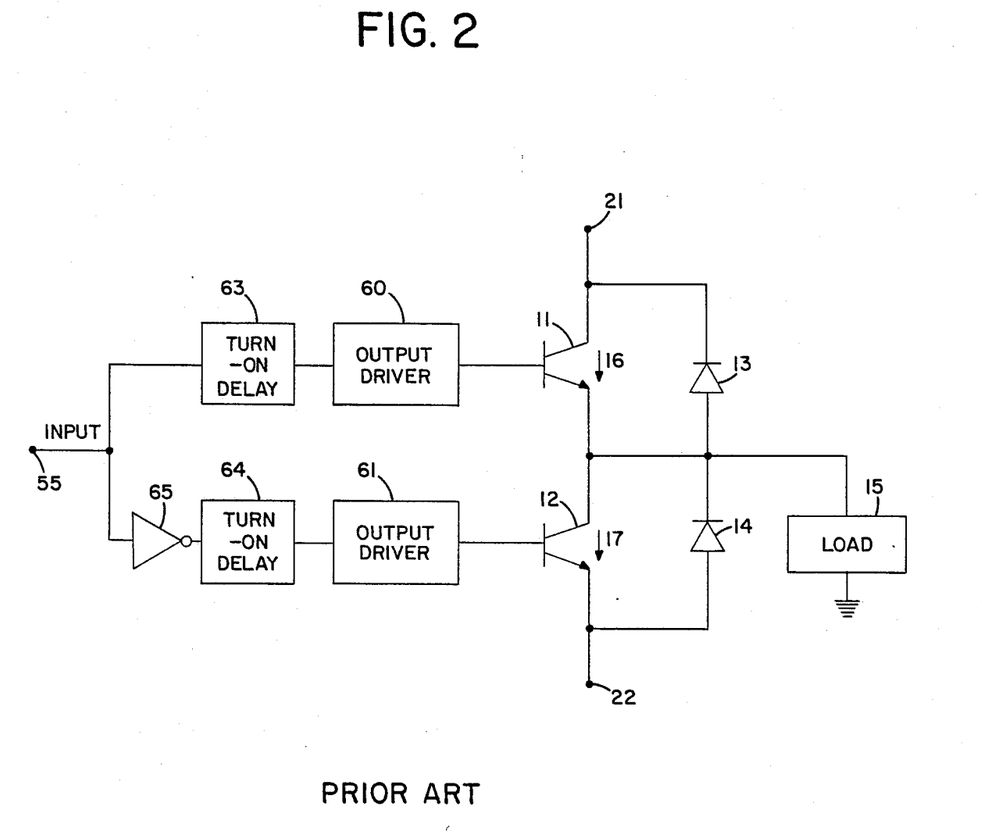
FIG. 2 is a prior art totem pole power amplifier operated in the switch mode with only fixed time delays.

The circuit shown in FIG. 1 can be operated in the switch mode (i.e. pulse width modulated) or in the amplifier mode (i.e. linear region). A typical prior art circuit for operating a totem pole power amplifier in the switch mode is shown in FIG. 2 where a digital pulse width modulated input signal 55, typically with a duration of 200 μsec, is fed to the circuit to activate transistors 11 and 12. The control circuitry consists of turn-on delays 63 and 64 and output drivers 60 and 61. Turn-on delay 60 delays the propogation of the positive going input pulse by some fixed amount of time. Typically, this fixed delay is 10 to 20 μsec. After the fixed delay, the small input signal triggers output driver 60 which enables a large output current 16 to be supplied to load 15 through transistor 11. Turn-on delay circuit 64 operates in a similar manner to turn-on delay circuit 63 except that it delays the propogation of the negative going input pulse which is inverted by inverter 65. Turnon delays 63 and 64 are necessary to compensate for the storage time delay in transistors 11 and 12. Typically, turn-on delays 63 and 64 are fixed at the same value.

When input signal 55 triggers a change in the operation of transistors 11 and 12 from sinking current 17 to sourcing current 16, current 17 will continue to flow for some short period of time T since load 15 is typically inductive. The time period T is defined as:

T=ts+tf where ts =storage time and tf =current fall time. The turn-on delay time T(on) of turn-on delays 63 and 64 must be at least as long as the maximum time T during which current will continue to flow after transistor 12 has been turned off. Thus, T(on) ≧ T or T(on) ≧ ts +tf.

The storage time ts of a power transistor or, for that matter, any transistor varies with respect to the collector current. The larger the collector current, the longer the storage time ts. T(on) must be selected for the worst case situation where ts is the longest storage time that possibly can be experienced by transistors 11 and 12. This selection, however, leads to exaggerated turn-on delays when the storage time is at a minimum. Additionally, this fixed time delay limits the bandwidth of the input signal by limiting how frequently transistors 11 and 12 can be turned on and off.

The circuit shown in FIG. 2 for implementing a fixed time delay is an open-loop circuit since no feedback from transistors 11 and 12 is utilized. An open-loop system, however, creates the danger of catastrophic failure. If, for example, one of the transistors 11 or 12 were to fail, which is not uncommon, the time delay and driver circuits, unaware of the failure, would proceed to turn on the opposite transistor in response to the input signal causing stress in that device and, potentially, causing a catastrophic failure.

Figure 3:
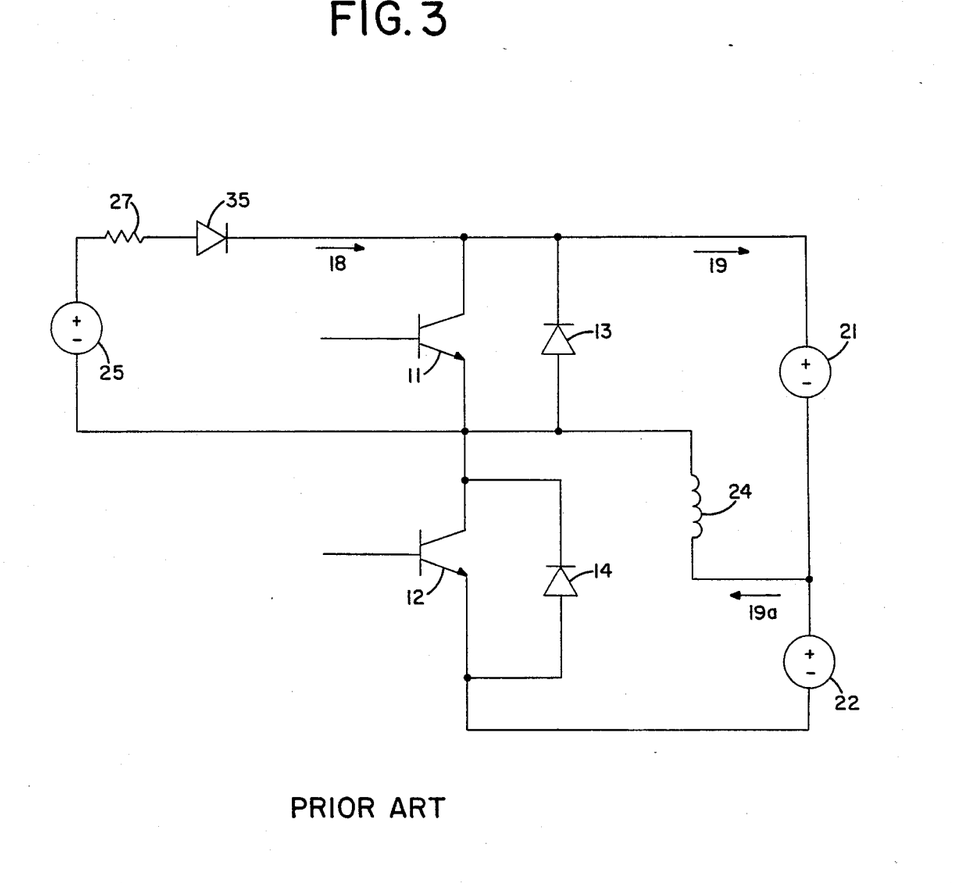
FIG. 3 is a prior art saturation detector.

One way to determine if failure has occurred is to monitor the state of the transistors. FIG. 3 shows a prior art measuring circuit of a monitoring device for determining whether transistor 11 is in saturation or whether transistor 11 is off and diode 13 is on. A floating power supply, modeled as a voltage supply 25 and a source resistance 27 is attached to the collector and emitter of transistor 11. Current 18 is measured to determine if transistor 11 is in saturation. If current 18 is flowing, transistor 11 is supposed to be in saturation. Diode 35 protects the floating supply when the collector to emitter voltage of transistor 11 is quite large (i.e. |V(+)+V(−)|) such as when transistor 11 is not in saturation.

If the monitoring device senses that current 18 is flowing, a signal will be sent indicating that transistor 11 is in saturation. However, a false signal can be sent if transistor 11 is not in the saturation condition but is off and diode 13 is on, i.e. freewheeling. In this case a negative voltage appears across the collector-emitter of transistor 11 and current 18 will flow through the path indicated by arrows 18, 19 and 19a. This false signal, of course, will slow down any response which is waiting for the transistor to turn off and go out of saturation. A more accurate monitoring device is needed, which does not give an improper "in saturation" signal.

There is a need for a time delay circuit which overcomes the problems of the prior art open-loop turn-on delays, namely, exaggerated turn-on delay times for most output conditions and no output feedback to prevent further failure and which overcomes the problems of the prior art feed back monitors, namely, an inaccurate signal.

SUMMARY OF THE INVENTION

Generally, the present invention provides a device for improving the switching performance of power transistors in a totem pole configuration. An improved detector is provided for monitoring and determining whether a transistor is in saturation. This detector provides a signal which is used by the time-delay means to improve the turn-on delay for the transistors.

In a switching circuit comprising two transistors in a totem pole configuration, two drivers to drive the transistors, two shunt diodes, two power supplies or a bipolar power supply and a load, an improved saturation detector is provided which monitors each transistor and determines whether or not it should be turned on or off. Each detector monitors one transistor to determine when it is in saturation and generates a feedback signal which is combined with the input signal to improve the switching time of the transistors. Preferably, the feedback signal from one transistor and the input signal are combined in a first time delay means to generate the appropriate time delay for the first transistor and the feedback signal from the other transistor and the inverted input signal are combined in a second time delay means to generate the appropriate time delay for the second transistor.

The improved saturation detector has a test current generator connected between the transistor's collector and emitter. If the transistor is in saturation, the test current flows to and through the transistor. If the transistor is off, the test current flows into a comparator which compares the transistor emitter voltage with a reference voltage (i.e. the collector voltage). When the transistor is on, the emitter voltage is almost the same as the collector voltage causing no current to flow to the comparator. This enables the test current to flow to and through the transistor. When the transistor is off, however, the emitter voltage is much lower than the collector voltage which causes the test current to flow into the comparator. By using a sensor to detect when the test current flows to the transistor instead of the comparator, one can determine that the transistor is in saturation and use this to generate the feedback signal which is combined in the time delay means with the input signal.

DESCRIPTION OF THE PREFERRED EMBODIMENTS

Figure 4:
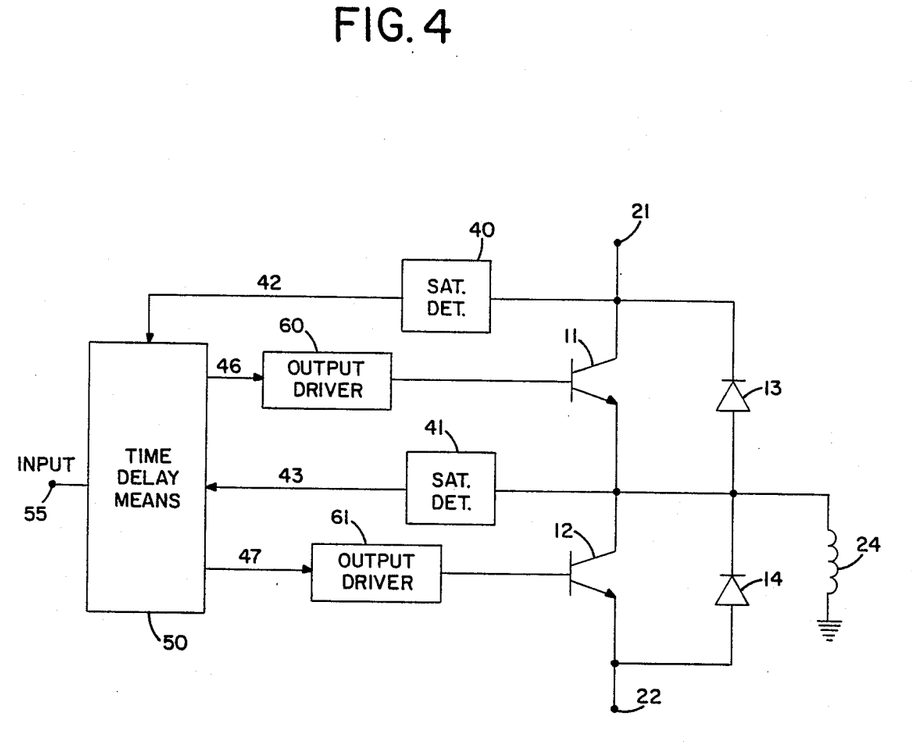
FIG. 4 is a block diagram of the present invention.

Shown in FIG. 4 is a preferred embodiment of the present invention which utilizes an improved saturation detector for determining when transistors 11 and 12 are in saturation. Saturation detector 40 monitors transistor 11 to determine when transistor 11 is in saturation. Similarly, saturation detector 41 monitors transistor 12 to determine when transistor 12 is in saturation.

Saturation detectors 40 and 41 send saturation signals 42 and 43, respectively, to time delay means 50 whenever transistors 11 or 12 go out of saturation. Time delay means 50 combines saturation signals 42 and 43 with pulse width modulated input signal 55 to produce driver activation signals 46 and 47 which activate output drivers 60 and 61, respectively, which turn on transistors 11 or 12, respectively. Transistors 11 and 12 regulate the flow of power to inductive load 24.

Only one transistor should be turned on at a time. If transistor 11 is on and input signal 55 changes so that transistor 12 is to be turned on, time delay means 50 stops sending driver activation signal 46 so that transistor 11 turns off. As soon as transistor 11 goes out of saturation and turns off, saturation detector 40 senses this and sends saturation signal 42 to time delay means 50. Time delay means 50 combines signal 42 with input signal 55 to produce driver activation signal 47 which through output driver circuit 61 turns on transistor 12. There is, thus, no need for any fixed time delays or worst case situations since time delay means 50 turns on the desired transistor only after determining that the opposite transistor has been turned off.

A similar sequence of events occurs if transistor 12 is on and it is to be turned off while transistor 11 is to be turned on. Input 55 causes time delay means 50 to stop sending driver activation signal 47 which turns off transistor 12. Saturation detector 41 senses when transistor 12 is no longer in saturation and sends saturation signal 43 to time delay means 50 where it is combined with input signal 55 to produce driver activation signal 46 which through output driver circuit 60 turns on transistor 11.

Figure 5:
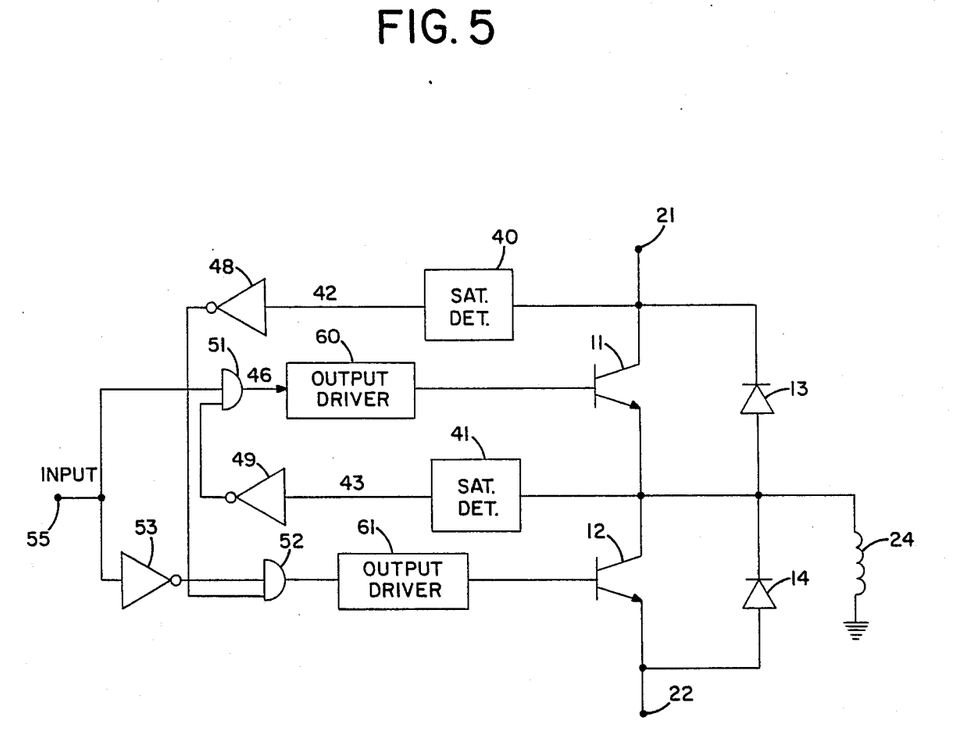
FIG. 5 is a circuit diagram of a preferred embodiment of the present invention.

FIG. 5 is the same as FIG. 4 except that the preferred circuitry for time delay means 50 is shown. Preferably, time delay means 50 consists of two AND gates, 51 and 52, and three inverters, 48, 49, and 53. Inverter 53 inverts input signal 55 so that only one transistor can be on at a time. AND gates 51 and 52 combine the inverted feedback signals, (i.e., saturation signals 42 and 43 after they have been inverted by inverters 48 and 49, respectively, from saturation detectors 40 and 41 with input signal 55 to permit output drivers 60 and 61 to turn on transistors 11 and 12, respectively, only when the other transistor has turned off.

For example, if input signal 55 in FIG. 5 is high, transistor 11 will be on and transistor 12 will be off. Inverter 53 makes the input to AND gate 52 low, ensuring that transistor 12 is off. Since transistor 12 is off, saturation detector 41 senses this and saturation signal 43 will be low, thus making the inverted saturation signal high. AND gate 51 combines the high input signal 55 with the inverted saturation signal 43 making driver activation signal 46 high, ensuring that transistor 11 is on. Saturation detector 40 senses that transistor 11 is on (i.e. in saturation) and saturation signal 42 will be high. The inverted saturation signal will be low and this ensures that driver activation signal 47 will be low, keeping transistor 12 off.

If input signal 55 now goes low, indicating that transistor 11 is to be turned off and transistor 12 turned on, AND gate 51 immediately switches driver activation signal 46 low which turns off transistor 11. As indicated in the Background Section, the time it takes transistor 11 to turn off depends upon ts and tf, which vary depending upon the magnitude of the collector current. Saturation detector 40, however, senses when transistor 11 is actually off. There is no need to estimate ts and tf or plan for worst case values. As soon as transistor 11 is actually off, saturation detector 40 makes saturation signal 42 low, thus making the inverted saturation signal high. AND gate 52 then makes driver activation signal 47 high only when both the inverted input signal is high and the inverted saturation signal 42 is high. A high driver activation signal 47 turns on transistor 12 through output driver 62. Saturation detector 41, sensing that transistor 12 has turned on and is in saturation causes saturation signal 43 to go high. This makes the inverted saturation signal low, ensuring that driver activation signal 46 is low and transistor 11 is off.

A similar sequence of events occurs when transistor 12 is turned off and transistor 11 is turned on. The cycle then repeats itself in response to the variations in input signal 55.

Figure 6:
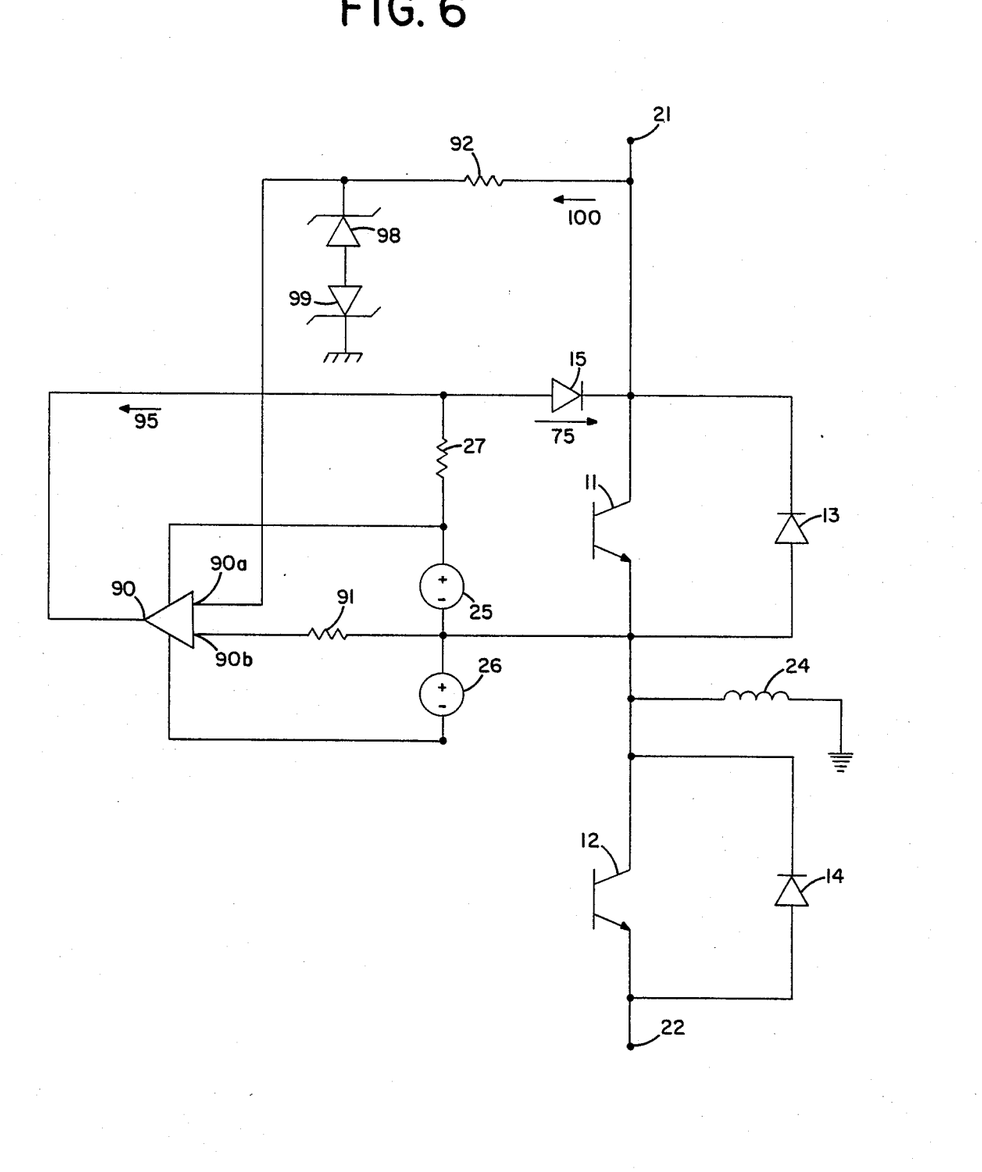
FIG. 6 is a circuit diagram of a preferred embodiment of a saturation detector used in the present invention.

FIG. 6 shows a preferred embodiment of saturation detector 40. Preferably, saturation detectors 40 and 41 are the same, although it is not required. Saturation detector 40 overcomes the problem with the prior art saturation detector because it can distinguish between true saturation (i.e. when transistor 11 is actually in saturation) and the condition where current is flowing in diode 13 but transistor 11 is not in saturation.

Saturation detector 40 accomplishes this distinction by using an open collector comparator 90. If transistor 11 is in saturation, inputs 90a and 90b of comparator 90 will be equal, making current 95 zero. This enables the current from source 25 to flow as current 75. If, however, transistor 11 is not in saturation and diode 13 is on, current 75 will not flow. The current from source 25 will be shunted by comparator 90 as current 95 since inputs 90a and 90b will no longer be equal. Thus, current 75 can be utilized to provide an accurate saturation signal 42 to time delay means 50. Preferably current 75 is used in connection with an optical coupling to isolate it from saturation signal 42. The following additional elements are used in the circuit shown in FIG. 6: elements 91 and 92 are 5.1K Ω resistors which limit the current to inputs 90a and 90b; and elements 98 and 99 are 1N4733 zener diodes which limit the input voltage of input 90a. Current 100 is preferably limited to 100mA.

Figure 7:
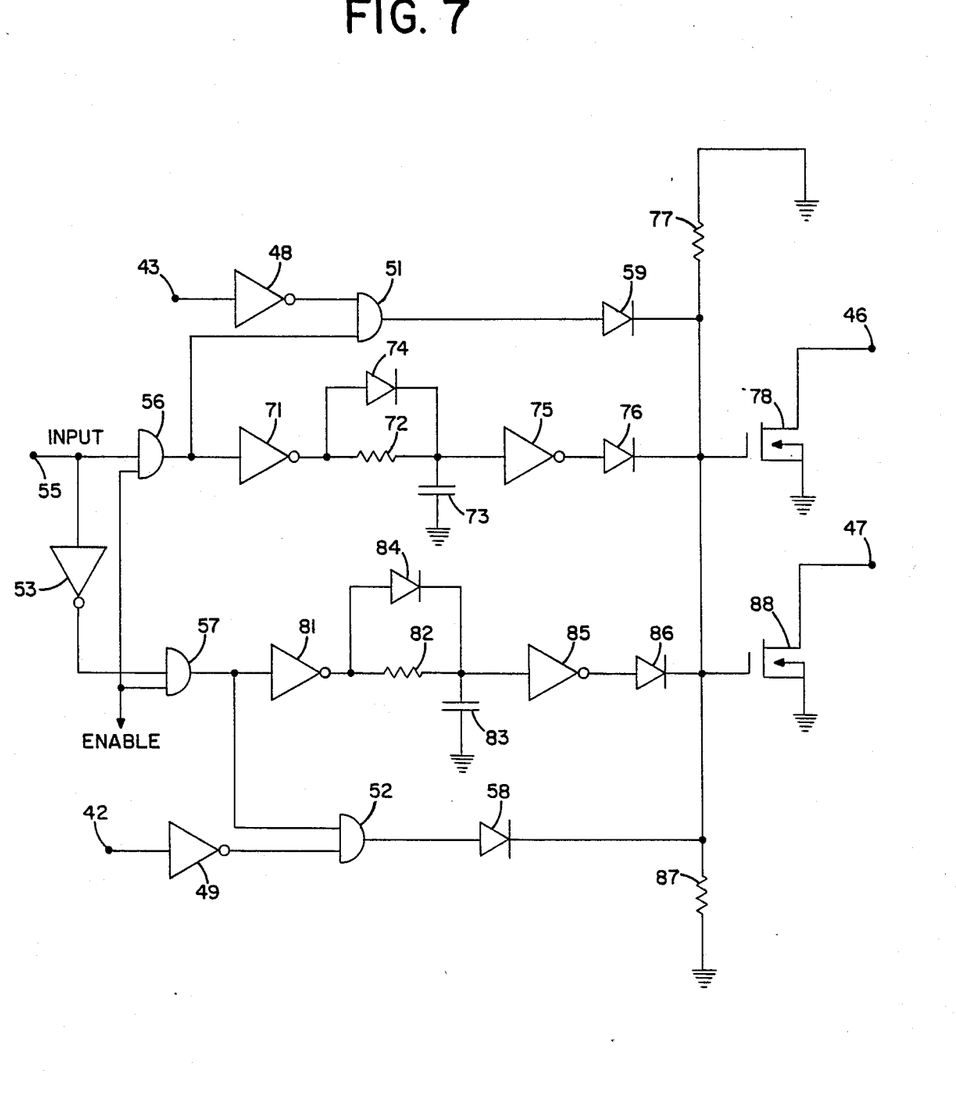
FIG. 7 is a circuit diagram of a preferred embodiment of the present invention with a fixed time delay added.

FIG. 7 shows an embodiment of time delay means 50 which also incorporates a fixed time delay and a separate enable function. Before input signal 55 reaches AND gates 51 and 52, it is put through AND gates 56 and 57 which each have one input connected to an enable switch. This prevents input signal 55 from activating the switching circuit until an enable signal is received.

Circuits elements 71-76 and 81-86 set a fixed time delay depending upon the RC time constant which is determined by elements 72, 73 and 82, 83, respectively. The following elements are used in the circuit shown in FIG. 7: elements 48, 49, 53, 71, 75, 81, and 85 are 74C14 inverters; elements 51, 52, 56, and 57 are 4081 AND gates; elements 58, 59, 76, and 86 are 1N4148 diodes; elements 72, 77, 82, and 87 are 1OK Ω resistors; elements 73 and 83 are 0.001 μf capacitors; and elements 78 and 88 are VN1OKM FET's. The RC time constant for the fixed time delay with these elements is 10 μsec.

While presently preferred embodiments of the best mode of the invention have been described in particularity, the invention may be otherwise embodied within the scope of the appended claims.

What is claimed is:

1. In a switching circuit comprising first and second transistors electrically connected to an input signal in a totem pole configuration, first and second drivers electrically connected to said first and second transistors, respectively, for driving same, first and second shunt diodes electrically connected across said first and second transistors, respectively, a power supply and a load, the improvement in combination therewith comprising a saturation detector connected to each of said first and second transistors for monitoring the saturation state of the respective transistor and generating a feedback signal which is combined with said input signal to improve the switching time of the transistors.

2. The improvement described in claim 1 wherein the feedback signal is combined with the input signal in a time delay means.

3. The improvement described in claim 2 wherein the time delay means comprises:
    (a) an inverter means connected to said input signal for generating an inverted input signal;
    (b) a first time delay means connected to said input signal and second saturation means for combining the input signal with the saturation signal from the second transistor and sending an activation signal to the first transistor; and
    (c) a second time delay means connected to said inverted input means and said first saturation means for combining the inverted input signal with the saturation signal from the first transistor and sending an activation signal to the second transistor.

4. The improvement described in claim 3 wherein the first time delay means comprises an AND gate and a driver and the second time delay means comprises an AND gate and a driver.

5. The improvement described in claim 4 wherein the saturation detector for one transistor comprises:
    (a) a test current generator connected between the transistor collector and emitter for generating a test current;
    (b) a comparator connected to the transistor collector and emitter for comparing the voltages thereof such that when the voltages are unequal, the test current is diverted to the comparator rather than being allowed to flow to the transistor; and 6. The improvement described in claim 3 wherein the saturation detector for one transistor comprises:
    (a) a test current generator connected between the transistor collector and emitter for generating a test current;
    (b) a comparator connected to the transistor collector and emitter for comparing the voltages thereof such that when the voltages are unequal, the test current is diverted to the comparator rather than being allowed to flow to the transistor; and
    (c) a sensor which detects when the test current is flowing to the transistor and generates a feedback signal.
    (c) a sensor which detects when the test current is flowing to the transistor and generates a feedback signal.

* * * * *

UNITED STATES PATENT AND TRADEMARK OFFICE
CERTIFICATE OF CORRECTION

PATENT NO. : 4,910,416
DATED : March 20, 1990
INVENTOR(S) : Michael D. Salcone

It is certified that error appears in the above-identified patent and that said Letters Patent is hereby corrected as shown below:

Column 6, line 27, please delete "4" and substitute --3--.

Column 6, line 36, after "and", please insert
--(c) a sensor which detects when the test current is flowing to the transistor and generates a feedback signal.--

Column 6, line 37, please delete "3" and substitute --4--.

Column 6, line 50, please delete the second occurrence of
"(c) a sensor which detects when the test current is flowing to the transistor and generates a feedback signal."

Signed and Sealed this

Twenty-third Day of April, 1991

Attest:

HARRY F. MANBECK, JR.

*Attesting Officer*

Commissioner of Patents and Trademarks